(12) United States Patent
Kim et al.

(10) Patent No.: US 7,850,336 B2
(45) Date of Patent: Dec. 14, 2010

(54) LIGHT EMITTING MODULE AND DISPLAY DEVICE HAVING THE SAME

(75) Inventors: Gi-Cherl Kim, Yongin-si (KR);
Eun-Jeong Kang, Cheonan-si (KR);
Seok-Won Kang, Gwangju-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 472 days.

(21) Appl. No.: 11/932,541

(22) Filed: Oct. 31, 2007

(65) Prior Publication Data
US 2008/0106894 A1    May 8, 2008

(30) Foreign Application Priority Data
Nov. 3, 2006    (KR)    .................. 10-2006-0108055

(51) Int. Cl.
*F21V 9/00*    (2006.01)
(52) U.S. Cl. .................. 362/231; 362/249.02
(58) Field of Classification Search .................. 362/231, 362/249.02
See application file for complete search history.

(56) References Cited
U.S. PATENT DOCUMENTS
6,513,949 B1 *   2/2003  Marshall et al. ............. 362/231
6,979,104 B2 *  12/2005  Brass et al. .................. 362/231
2004/0066651 A1  4/2004  Harumoto
2005/0063194 A1  3/2005  Lys et al.
2006/0081773 A1  4/2006  Rains, Jr. et al.
2007/0029915 A1 *  2/2007  Kim et al. .................... 313/483

FOREIGN PATENT DOCUMENTS
| EP | 1 103 759 A2 | 5/2001 |
| EP | 1 641 043 A1 | 3/2006 |
| JP | 06-102503 | 4/1994 |
| JP | 07-129097 | 5/1995 |
| JP | 07-129101 | 5/1995 |
| WO | WO 2006 105649 A1 | 10/2006 |

OTHER PUBLICATIONS

European Search Report dated Apr. 14, 2009 for European Application No. 07021413.5.

* cited by examiner

*Primary Examiner*—David V Bruce
(74) *Attorney, Agent, or Firm*—F. Chau & Associates, LLC

(57) ABSTRACT

A light emitting module includes a plurality of point light sources and a substrate applying driving power. Each of the point light sources includes a first light emitting chip emitting first light, a second light emitting chip emitting second light, and a third light emitting chip emitting third light. At least one restriction light emitting chip among the first, second and third light emitting chips has a larger light emitting area than that of a remainder of the light emitting chips, so that a light emitting intensity enough to display white light by mixing the first, second and third light is obtained.

20 Claims, 5 Drawing Sheets

LIGHT EMITTING MODULE AND DISPLAY DEVICE HAVING THE SAME

CROSS-REFERENCE TO RELATED APPLICATION

This application claims priority to Korean Patent Application No. 2006-108055, filed on Nov. 3, 2006, the disclosure of which is herein incorporated by reference in its entirety.

BACKGROUND OF THE INVENTION

1. Technical Field

The present invention relates to a light emitting module and a display device having the light emitting module, and more particularly, to a light emitting module capable of enhancing light emitting efficiency to obtain white light a display device having the light emitting module.

2. Discussion of the Related Art

A display apparatus includes a backlight assembly providing light to a display panel to display an image. A light source used for the backlight assembly includes a cold cathode fluorescent lamp (CCFL), and a light emitting diode (LED) having low power consumption, low volume and low weight. The LED is widely used for the light source of the backlight assembly due to efficiency of the LED The backlight assembly emits white light for a liquid crystal display (LCD) apparatus to display the image. Red light, green light and blue light emitted from a red LED, a green LED and a blue LED are mixed to be the white light, to enhance light reproducibility of the image displayed by the LCD apparatus. The white light passes through a liquid crystal layer to control the light intensity, and the white light passes through a color filter to display the color of each pixel.

Light-electrical efficiency of the LED may be different according to a structure of a light emitting chip and a packaging method, but wavelengths of the red light, the green light and the blue light may be about 625 nm, about 525 nm and about 455 nm, respectively. The red, green and blue LEDs respectively have light intensities of about 40 lm/W, about 45 lm/W and about 10 lm/W in the same condition, such as unit power consumption and unit light emitting area.

When the red light, the green light and the blue light are mixed with a ratio of 3:6:1 with respect to the light intensity to be the white light, the red LED and the blue LED may respectively emit about 30 lm red light and about 10 lm blue light, but the green LED only emits about 45 lm in the condition of the unit power consumption and the unit light emitting area. Thus, the light intensity of the green light is insufficient to emit the white light. Two green LEDs can be used in an R, G, G, B array to increase the light intensity of the green light.

The light-electrical efficiency of the LED is continuously enhanced to meet the light intensity to emit the white light. The wavelength of the blue light is preferable to be close to about 450 nm than the present wavelength which is about 455 nm to enhance the light-electrical efficiency of the LED and the light reproducibility. When the wavelength of the blue light is about 450 nm or lower than about 450 nm, the light intensity of the blue light may be insufficient to emit the white light. Alternatively, the light intensity of the red light may be insufficient to emit the white light.

The red, green and blue LEDs having substantially same light emitting area are used to emit the white light. However, since the light-electrical efficiency of the LEDs are continuously enhanced as mentioned above, when the red, green and blue LEDs having the same light emitting area are used, at least one of the red, green and blue LEDs may have the light emitting area smaller or larger than the light emitting area required to emit the white light. Thus, light emitting efficiency is decreased, so that the backlight module is designed considering the light-electrical efficiency of the LED and the light emitting area required to emit the white light.

BRIEF SUMMARY OF THE INVENTION

Embodiments of the present invention provide a light emitting module for efficiently obtaining white light by forming light emitting areas of light emitting chips different from each other and a display device having the light emitting module.

In an exemplary embodiment of the present invention, a light emitting module includes a plurality of point light sources and a substrate. The plurality of point light sources has a first light emitting chip emitting first light, a second light emitting chip emitting second light, and a third light emitting chip emitting third light. The substrate has the point light sources disposed on the substrate, and applies driving power to the point light sources. At least one restriction light emitting chip among the first, second and third light emitting chips has a larger light emitting area than a remainder of the light emitting chips.

The first, second and third light emitting chips have light emitting intensities of L1, L2 and L3 per unit power consumption and unit light emitting area, respectively, and the restriction light emitting chip has the largest value among x/L1, y/L2 and z/L3, when the first light, the second light and the third lights are mixed with a ratio of x:y:z to be white light. x is a ratio light intensity of the first light with respect to the white light, y is a ratio light intensity of the second light with respect to the white light, and z is a ratio light intensity of the third light with respect to the white light. The light emitting areas of the first, second and third light emitting chips are in a relationship of x/L1<y/L2<z/L3. The light emitting area of the first light emitting chip:the light emitting area of the second light emitting chip:the light emitting area of the third light emitting chip is substantially the same as x/L1:y/L2:z/L3. The light emitting area of the restriction light emitting chip is about twice to five times larger than the light emitting areas of the remainder of the light emitting chips. The first light emitting chip includes a red light emitting chip emitting red light, the second light emitting chip includes a green light emitting chip emitting green light, and the third light emitting chip includes a blue light emitting chip emitting blue light. The first, second and third lights are mixed with a ratio of x:y:z to form white light. x is between about 2.91 to about 3.09, y is between about 5.82 to about 6.18, and z is between about 0.97 to about 1.03.

The restriction light emitting chip includes the blue light emitting chip. A wavelength of the red light ($\lambda 1$), a wavelength of the green light ($\lambda 2$) and a wavelength of the blue light ($\lambda 3$) are respectively between about 619 nm to about 631 nm, between about 518 nm to about 530 nm and between about 446 nm to about 455 nm, and a light emitting intensity of the red light emitting chip (L1), a light emitting intensity of the green light emitting chip (L2) and a light emitting intensity of the blue light emitting chip (L3) per unit power consumption and unit light emitting area are respectively between about 237 lumen to about 239 lumen, between about 541 lumen to about 546 lumen and between about 19.8 lumen to about 20 lumen. The light emitting area of the blue light emitting chip is about twice to about five times larger than that the light emitting area of the red light emitting chip or that the light emitting area of the green light emitting chip. The light emitting area of the red light emitting chip is substantially the same as that the light emitting area of the green light emitting chip. The point light sources include a plurality of blue light emitting chips. The point light sources include two blue light emitting chips, and each of the blue light emitting chips has substantially the same light emitting area as that the light emitting areas of the red light emitting chip and the green light emitting chip.

The restriction light emitting chip includes the green light emitting chip. A wavelength of the red light ($\lambda 1$), a wavelength of the green light ($\lambda 2$) and a wavelength of the blue light ($\lambda 3$) are respectively between about 619 nm to about 631 nm, between about 518 nm to about 530 nm and between about 450.5 nm to about 460 nm, and the light emitting intensity of the red light emitting chip (L1), the light emitting intensity of the green light emitting chip (L2) and the light emitting intensity of the blue light emitting chip (L3) per unit power consumption and unit light emitting area are respectively between about 39.6 lumen to about 40.4 lumen, between about 44.6 lumen to about 45.4 lumen and between about 9.9 lumen to about 10.1 lumen. The light emitting area of the green light emitting chip is about twice to five times larger than the light emitting area of the red light emitting chip and the blue light emitting chip. The light emitting area of the red light emitting chip is substantially the same or different from that the light emitting area of the blue light emitting chip.

The light emitting areas of the first, second and third light emitting chips may be in a relationship of x/L1>y/L2, x/L1<z/L3, and y/L2<z/L3.

x/L1 and y/L2 may be substantially the same. The light emitting area of the red light emitting chip may be different from the light emitting area of the green light emitting chip.

In another exemplary embodiment of the present invention, a display device includes a plurality of point light sources and a substrate. The plurality of point light sources has a first emitting chip emitting first light, a second light emitting chip emitting second light, and a third light emitting chip emitting third light. The substrate has the point light sources disposed on the substrate, and the substrate applies a driving power to the point light sources.

At least one restriction light emitting chip among the first, second and third light emitting chips has a larger light emitting area than a remainder of the light emitting chips.

The first light emitting chip includes a red light emitting chip emitting red light, the second light emitting chip includes a green light emitting chip emitting green light, and the third light emitting chip includes a blue light emitting chip emitting blue light.

The restriction light emitting chip includes the blue light emitting chip.

According to the present invention, the light intensity of the light emitting chip having insufficient light intensity to obtain the white light is increased, and the light emitting area that is not used is eliminated, so that light emitting efficiency of the light emitting module may be enhanced.

BRIEF DESCRIPTION OF THE DRAWINGS

Exemplary embodiments of the present invention can be understood in more detail from the following descriptions taken in conjunction with the accompanying drawings, in which.

DESCRIPTION OF EXEMPLARY EMBODIMENTS

The invention is described more fully hereinafter with reference to the accompanying drawings, in which embodiments of the invention are shown. This invention may, however, be embodied in many different forms and should not be construed as limited to the embodiments set forth herein.

It will be understood that when an element or layer is referred to as being "on," "connected to" or "coupled to" another element or layer, it can be directly on, connected or coupled to the other element or layer or intervening elements or layers may be present. Like numbers may refer to like elements throughout. As used herein, the term "and/or" includes any and all combinations of one or more of the associated listed items.

Figure 1:
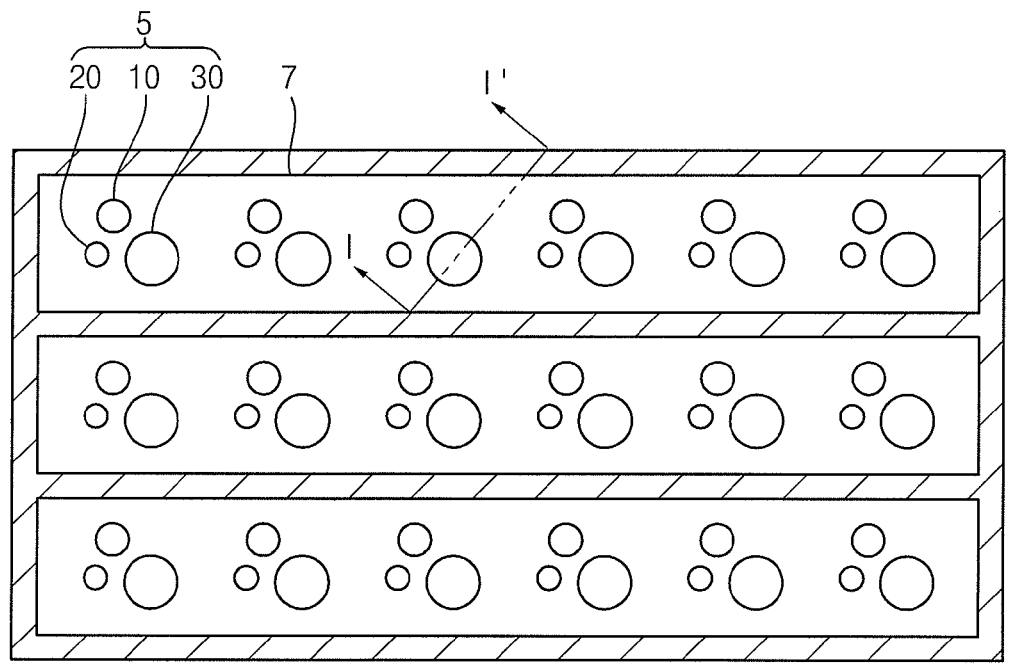
FIG. 1 is a plan view illustrating a light emitting module according to an exemplary embodiment of the present invention.
Figure 2:
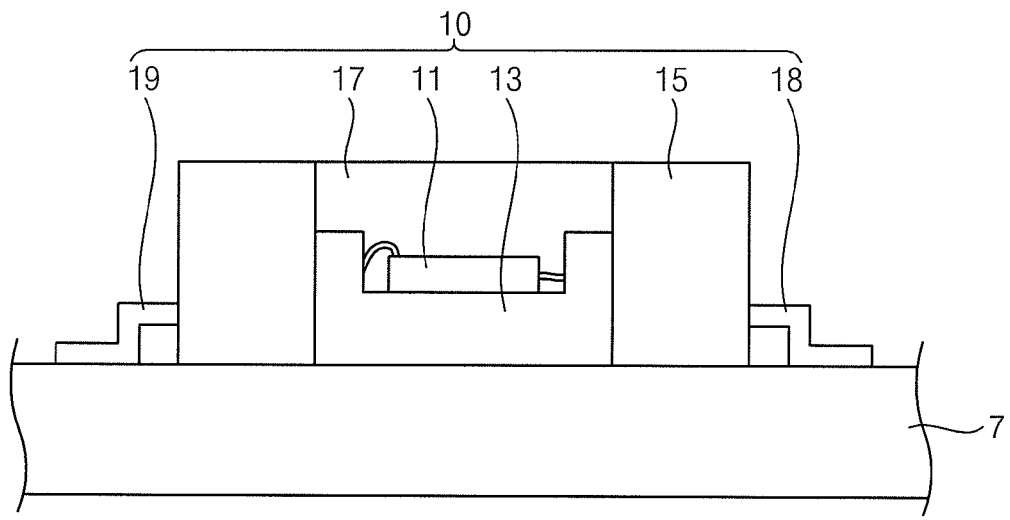
FIG. 2 is a cross-sectional view taken along a line I-I' of FIG. 1.

FIG. 1 is a plan view illustrating a light emitting module 1 according to an exemplary embodiment of the present invention. FIG. 2 is a cross-sectional view taken along a line I-I' of FIG. 1.

Referring to FIGS. 1 and 2, the light emitting module 1 includes a plurality of point light sources 5 and a substrate 7.

Each of the point light sources 5 includes a first light emitting chip 10, a second light emitting chip 20 and a third light emitting chip 30. As illustrated in FIG. 2, the first, second and third light emitting chips 10, 20 and 30 are respectively packaged.

The first light emitting chip 10 may include a light emitting body 11, a heat dissipating body 13, a housing 15, a protective layer 17, a power input terminal 18 and a power output terminal 19. For example, the light emitting body 11 may be a P-N junction diode. The light emitting body 11 is disposed on the heat dissipating body 13.

The heat dissipating body 13 and the light emitting body 11 are received by the housing 15. The protective layer 17 covers the light emitting body 11 to protect the light emitting body 11. The power input terminal 18 and the power output terminal 19 are electrically connected to the light emitting body 11, respectively.

The second and third light emitting chips 20 and 30 have the same structure as the first light emitting chip 10.

The substrate 7 applies driving power to the first, second and third light emitting chips 10, 20 and 30. The substrate 7 may be a metal core printed circuit board (PCB) or a general PCB. The substrate 7 may include a plurality of lines formed on the substrate 7. The lines are electrically connected to the power input terminal 18 and the power output terminal 19 of the first, second and third light emitting chips 10, 20 and 30. The substrate 7 may further include an insulating layer that insulates the lines from outside and is formed on the substrate 7.

The substrate 7 may receive the driving power from an external inverter. According as the driving power is applied to the substrate 7, the first, second and third light emitting chips 10, 20 and 30 respectively emits first light, second light and third light.

The light emitting module 1 may be used for a light source of a backlight in a liquid crystal display (LCD) apparatus. The light emitting module 1 may be used for both a direct-illumination type backlight assembly and an edge-illumination type backlight assembly. The LCD displays an image by using white light. Preferably, the first light, the second light and the third light are mixed to be the white light, so that light reproducibility of the image displayed by the LCD may be enhanced.

The LCD apparatus may include an optical element that mixes the first light, the second light and the third light to emit the white light. The white color passes through a liquid crystal for the light intensity to be controlled, and the white color passes through a color filter to display a color of each pixel.

The first light, the second light and the third light are mixed to have a predetermined ratio, for example x:y:z, with respect to the light intensity, so that the white light used for the LCD apparatus is emitted. A necessary mixing light intensity is defined as the light intensity of the first light, the second light and the third light required to emit the white light according to the ratio of the x:y:z.

Generally, a light emitting intensity of the light emitting chip depends on a light emitting area and power consumption. When the power consumption per unit light emitting area is maintained to be constant, the light emitting area is in direct proportion to the light emitting intensity. Alternatively, when the power consumption is increased in the constant light emitting area, the light emitting intensity increases to be saturated in a maximum light emitting intensity. In addition, the light emitting intensity of the light emitting chip may be different according to a light emitting color in conditions of the light emitting area and the power consumption per the same light emitting area (hereinafter, referred to as the same condition).

Accordingly, at least one of the first, second and third light emitting chips 10, 20 and 30 may have a light intensity that is insufficient to produce the white light when mixed with the remaining light of the other light emitting chips. A restriction light emitting chip is defined as the light emitting chip that has the insufficient light intensity under the same conditions among the first, second and third light emitting chips 10, 20 and 30.

A light-electrical efficiency of the light emitting chip is enhanced and various parameters for designing are optimized, to be sufficient for the necessary mixing light intensity. Alternatively, the light emitting area of the light emitting chip is increased to be sufficient for the necessary mixing light intensity.

In an exemplary embodiment, the third light emitting chip 30 is the restriction light emitting chip. In this case, when the light emitting area of the third light emitting chip 30 is larger than that of the first and second light emitting chips 10 and 20 as illustrated in FIG. 1, the third light emitting chip 30 may have a light intensity that is insufficient to produce the white light when mixed with the light of the light emitting chips 10, 20.

For example, the first, second and third light emitting chips 10, 20 and 30 respectively emit the first light, the second light and the third light with the light emitting intensity of L1, L2 and L3 per unit power consumption and unit light emitting area. Accordingly, when the power consumption per unit light emitting area is same and the ratio of the light emitting area is the same as 1/L1:1/L2:1/L3, the first, second and third light emitting chips 10, 20 and 30 respectively emit the first light, the second light and the third light with the same light intensity.

When the power consumption per unit light emitting area is same and the ratio of the light emitting area is the same as 1/L1:1/L2:1/L3, the ratio of light intensity of the first light, the second light and the third light is the same as x:y:z. x/L1:y/L2:z/L3 is defined as a necessary light emitting area ratio to obtain the white light.

The restriction light emitting chip is the light emitting chip corresponding to the maximum value among x/L1, y/L2 and z/L3. In the present example embodiment, the relation of x/L1<y/L2<z/L3 exists, and thus, the third light emitting chip 30 is the restriction light emitting chip as mentioned above.

The light emitting area of the first, second and third light emitting chips 10, 20 and 30 has the relationship x/L1>y/L2, x/L1<z/L3, y/L2<z/L3, as illustrated in FIG. 1. Preferably, the ratio of the light emitting area is the same as x/L1:y/L2:z/L3. The difference between the light emitting areas of the first and second light emitting chips may be minimal such that the light emitting areas of the first and second light emitting chips are substantially the same. Alternatively, when the light-electrical efficiency of the first light emitting chip is more enhanced, the light emitting area of the second light emitting chip may be larger than that of the first light emitting chips to satisfy the relationship x/L1<y/L2<z/L3.

Although the light emitting area of the third light emitting chip 30 differs according to the light-electrical efficiency of the light emitting chip, the light emitting area of the third light emitting chip 30 is preferably about twice to five times larger than that of the first and second light emitting chips 10 and 20.

Figure 3:
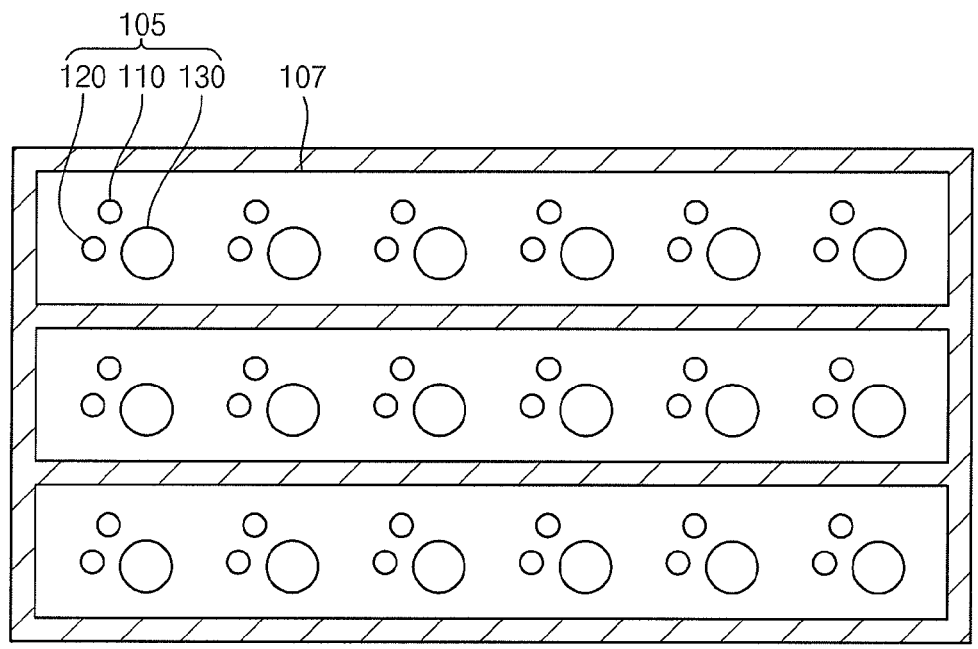
FIG. 3 is a plan view illustrating a light emitting module according to an exemplary embodiment of the present invention.

FIG. 3 is a plan view illustrating a light emitting module 100 according to an exemplary embodiment of the present invention.

Referring to FIG. 3, the light emitting module 100 includes a plurality of point light sources 105 and a substrate 107.

The light emitting module 100 according to the present example embodiment is substantially same as the light emitting module 1 illustrated in FIGS. 1 and 2, except the point light sources 105. Each of the point light sources 105 includes a first light emitting chip 110, a second light emitting chip 120 and a third light emitting chip 130. The point light sources 105 are substantially same as the point light sources 5 as illustrated in FIGS. 1 and 2, except a light emitting area of the light emitting chip.

In an exemplary embodiment, the third light emitting chip 130 is the restriction light emitting chip, and the light emitting area of the third light emitting area 130 may be about twice to five times larger than that of the first and second light emitting chips 110 and 120. In the present example embodiment, the relation of x/L1=y/L2, x/L1>y/L2 or x/L1<y/L2 may exist. When a difference between x/L1 and y/L2 is small enough, the light emitting area of the first and second light emitting chips 110 and 120 is substantially or almost the same as each other, as illustrated in FIG. 3.

Figure 4:
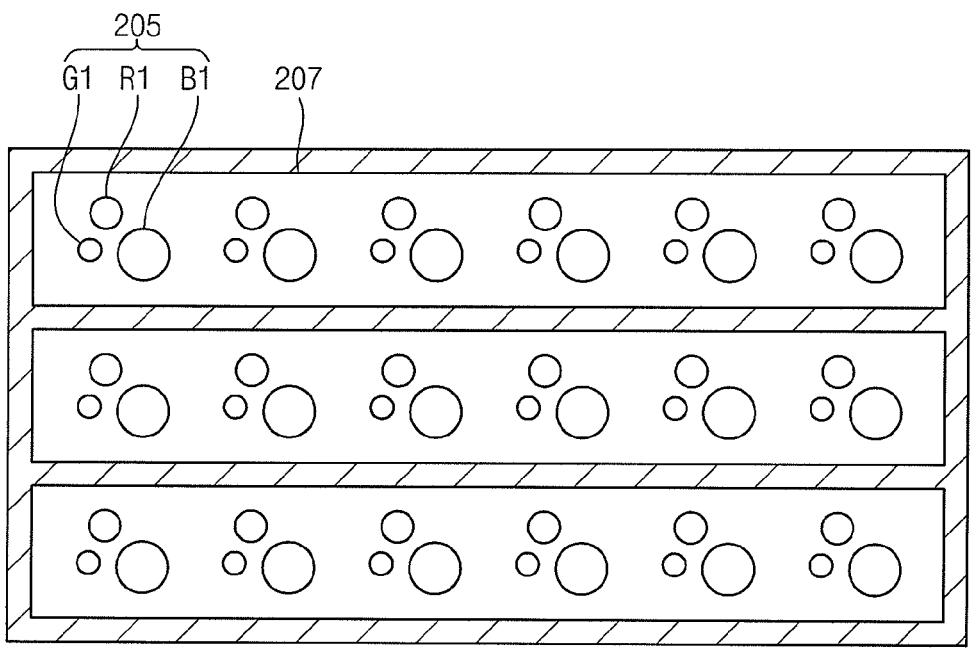
FIG. 4 is a plan view illustrating a light emitting module according to an exemplary embodiment of the present invention.

FIG. 4 is a plan view illustrating a light emitting module 200 according to an exemplary embodiment of the present invention.

Referring to FIG. 4, the light emitting module 200 includes a plurality of point light sources 205 and a substrate 207.

Each of the point light sources 205 includes a red light emitting chip R1 emitting red light, a green light emitting chip G1 emitting green light and a blue light emitting chip B1 emitting blue light. The light emitting module 200 is substantially same as the light emitting module 1 illustrated in FIGS. 1 and 2, except that the red, green and blue light emitting chip R1, G1 and B1 respectively correspond to the first, second and third light emitting chips 10, 20 and 30 in FIG. 1.

The white light as the backlight of the LCD apparatus may be emitted by mixing the red light, the green light and the blue light with the ratio of about x:y:z=3:6:1. Considering about 3% error, x:y:z may be between about 2.91 to about 3.09: between about 5.82 to about 6.18:between about 0.97 to about 1.03, in the present example embodiment.

When the light-electrical efficiency of the light emitting chip is continuously enhanced, and a wavelength of the blue light is close to about 455 nm to about 450 nm to enhance the light reproducibility, the light emitting chip may have the following characteristics.

The wavelengths $\lambda 1$, $\lambda 2$ and $\lambda 3$ of the red light, the green light and the blue light may be respectively about 625 nm, 525 nm, 450 nm. In the same condition, for example, the light emitting intensities L1, L2 and L3 of the red, green and blue light emitting chips R1, G1 and B1 per unit power consumption and unit light emitting area may be respectively about 239 lm, 546 lm and 20 lm.

Considering about 1% error, $\lambda 1$ may be between about 619 nm to about 631 nm, $\lambda 2$ may be between about 518 nm to about 530 nm, and $\lambda 3$ may be between about 444 nm to about 455 nm. The light emitting intensities L1, L2 and L3 of the red, green and blue light emitting chips R1, G1 and B1 may be respectively between about 237 lm to about 239 lm, between about 541 lm to about 546 lm and between about 19.8 lm to about 20 lm.

When x:y:z is about 3:6:1, the necessary light emitting area ratio is calculated, so that x/L1:y/L2:z/L3 is about 12.6:11.0: 50.0. Thus, the blue light emitting chip B1 corresponding to about 50.0 is the restriction light emitting chip.

Accordingly, although the light-electrical efficiency of the light emitting chip is increased, when the light emitting chip having the same area is used, the light intensity of the white light obtained from the power consumption provided to the light emitting module 200 mainly depends on the light-electrical efficiency of the blue light emitting chip B1. In addition, the light emitting area of the red and green light emitting chips R1 and G1 becomes excessively large.

The light emitting area of the blue light emitting chip B1 is formed to be larger than that of the red and green light emitting chips R1 and G1, to be sufficient for the necessary mix light intensity. In addition, the light emitting area of the red and blue light emitting chips R1 and G1 that is not used may be eliminated, to enhance light emitting efficiency of the light emitting module 200.

In addition, the red and green light emitting chips R1 and G1 respectively correspond to about 12.6 and about 11.0. Thus, the light emitting area of the red light emitting chip R1 is preferably larger than that of the green light emitting chip G1.

Alternatively, since the difference between about 12.6 and about 11.0 is not large enough, the light emitting area of the red light emitting chip R1 may be substantially same as that of the green light emitting chip G1. Alternatively, when the light-electrical efficiency of the red light emitting chip R1 is more enhanced, the light emitting area of the green light emitting chip G1 may be larger than that of the red light emitting chip R1.

Figure 5:
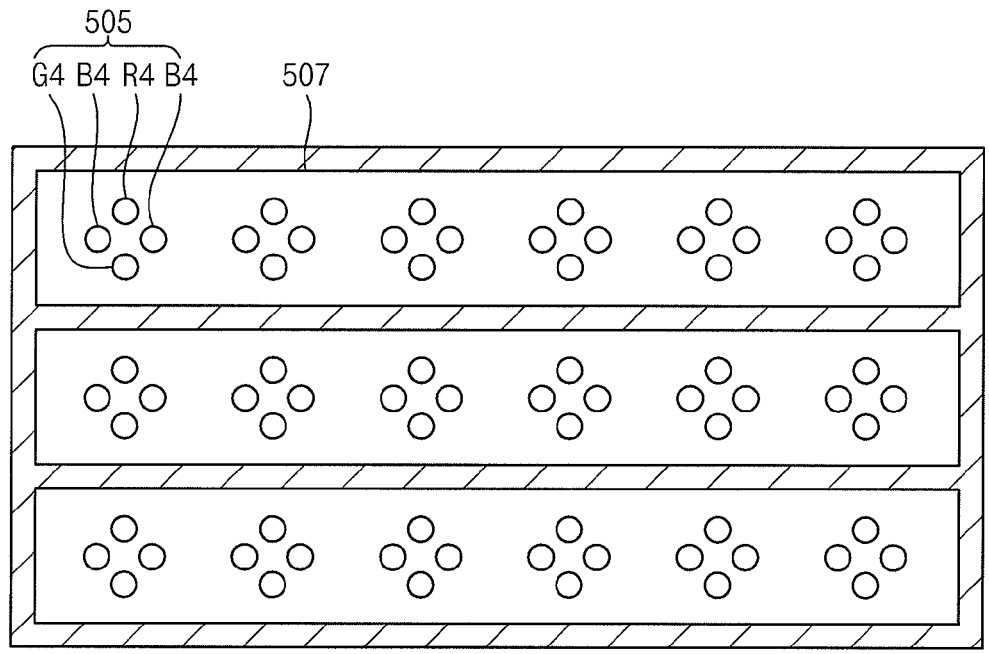
FIG. 5 is a plan view illustrating a light emitting module according to an exemplary embodiment of the present invention.

FIG. 5 is a plan view illustrating a light emitting module 500 according to an exemplary embodiment of the present invention.

Referring to FIG. 5, the light emitting module 500 includes a plurality of point light sources 505 and a substrate 507.

The light emitting module 500 is substantially same as the light emitting module 200 illustrated in FIG. 4, except the point light sources 505.

Each of the point light sources 505 includes a red light emitting chip R4, a green light emitting chip G4 and two blue light emitting chips B4. The light-electrical efficiency of each light emitting chip according to the present example embodiment is substantially same as that of each light emitting chip illustrated in FIG. 4. Thus, the blue light emitting chip B4 is the restriction light emitting chip, and the light intensity of the blue light is insufficient for the white light in the same condition.

In an exemplary embodiment, the light emitting areas of the red, green and blue light emitting chips R4, G4 and B4 are the same with one another. The point light sources 505 include two blue light emitting chips B4. Thus, the light emitting area through which the blue light passes is about twice as large as that of which the red light and the green light passes through.

The necessary light emitting area is the same as x/L1:y/L2: z/L3=12.6:11.0:50.0. Thus, the blue light needs more than four times larger light emitting area than that of the red light and the green light. When the power consumption per unit light emitting area is the same, the light intensity of the blue light is insufficient even if two blue light emitting chips B4 are used. Thus, the power consumption per the light emitting area of the blue light emitting chip B4 is maintained to be larger than that of the red and green light emitting chips R4 and G4, so that the light intensity of the blue light sufficient for emitting the white light may be obtained.

Alternatively, the light emitting area of one blue light emitting chip B4 is formed to be more than four times larger than that of the red and green light emitting chips R4 and G4, and the power consumption per the light emitting area is maintained to be the same, so that the light intensity of the blue light sufficient for emitting the white light may be obtained.

Figure 6:
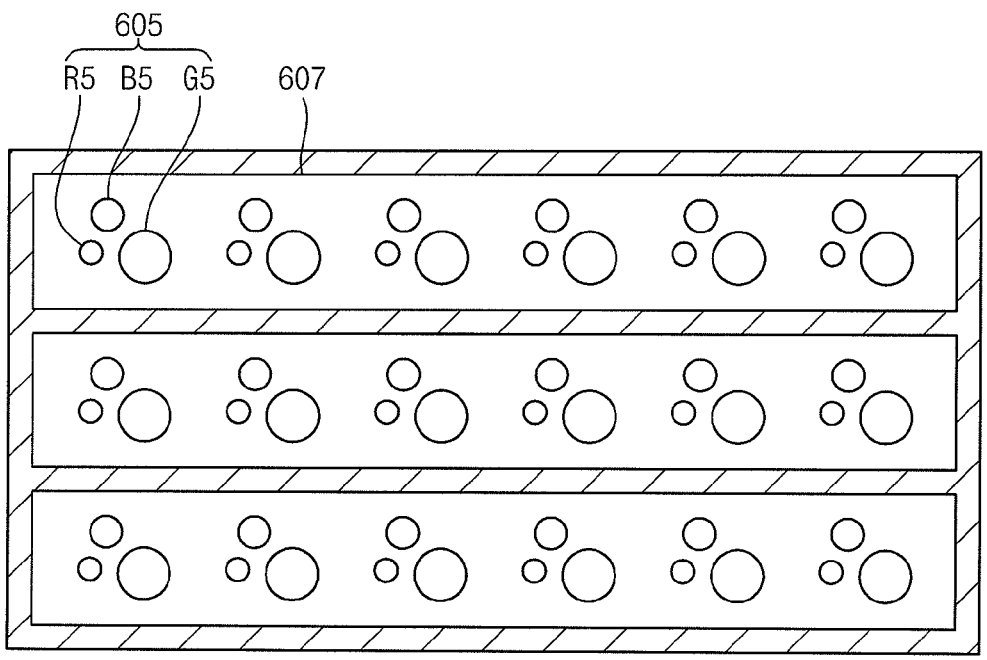
FIG. 6 is a plan view illustrating a light emitting module according to an exemplary embodiment of the present invention.

FIG. 6 is a plan view illustrating a light emitting module 600 according to an exemplary embodiment of the present invention.

Referring to FIG. 6, the light emitting module 600 includes a plurality of point light sources 605 and a substrate 607.

The light emitting module 600 according to the present example embodiment is substantially same as the light emitting module 200 illustrated in FIG. 4, except the point light sources 605. Each of the point light sources 605 includes a red light emitting chip R5, a green light emitting chip G5 and a blue light emitting chip B5. The light emitting chips is substantially same as the point light sources 205 as illustrated in FIG. 4, except the light-electrical efficiency and the light emitting area.

In the present example embodiment, the white light may be emitted by mixing the red light, the green light and the blue light with the ratio of about x:y:z=3:6:1. Each light emitting chip according to the present example embodiment has conventional light-electrical efficiency. Each light emitting chip has the following characteristics.

The wavelengths $\lambda 1$, $\lambda 2$ and $\lambda 3$ of the red light, the green light and the blue light may be respectively about 625 nm, 525 nm, 455 nm. In the same condition, for example, the light emitting intensities L1, L2 and L3 of the red, green and blue light emitting chips R1, G1 and B1 per unit power consumption and unit light emitting area may be respectively about 40 lm, 45 lm and 10 lm.

The wavelength of the light and the light emitting intensity may somewhat differ according to the structure of the light emitting chip and the method for packaging the light emitting chip. Considering 1% error, λ1 may be between about 619 nm to about 631 nm, λ2 may be between about 518 nm to about 530 nm and λ3 may be between about 450.5 nm to about 460 nm. The light emitting intensities per unit power consumption and unit light emitting area L1, L2 and L3 may be respectively between about 39.6 lm to about 40.4 lm, between about 44.6 lm to about 45.4 lm and between about 9.9 lm to about 10.1 lm.

When x:y:z is about 3:6:1, the necessary light emitting area ratio is calculated, so that x/L1:y/L2:z/L3 is about 75:113:100. Thus, the green light emitting chip G5 corresponding to about 133 is the restriction light emitting chip. Accordingly, the light emitting area of the green light emitting chip G5 is formed to be more than twice the size of the red and blue light emitting chips R5 and B5, so that the necessary mix light intensity of the green light may be sufficient. In addition, the light emitting areas of the red and blue light emitting chips R5 and B5 are formed not to be larger than is needed, so that total light emitting efficiency of the light emitting module 600 may be enhanced.

The red and blue light emitting chips R5 and B5 respectively correspond to about 75 and about 100. Thus, the light emitting area of the blue light emitting chip B5 is preferably larger than that of the red light emitting chip R5, as illustrated in FIG. 6.

Alternatively, the light emitting area of the red light emitting chip R5 may be the same as that of the blue light emitting chip B5. Alternatively, when the light-electrical efficiency of the blue light emitting chip B5 is more enhanced, the light emitting area of the red light emitting chip R5 may be larger than that of the blue light emitting chip B5.

Figure 7:
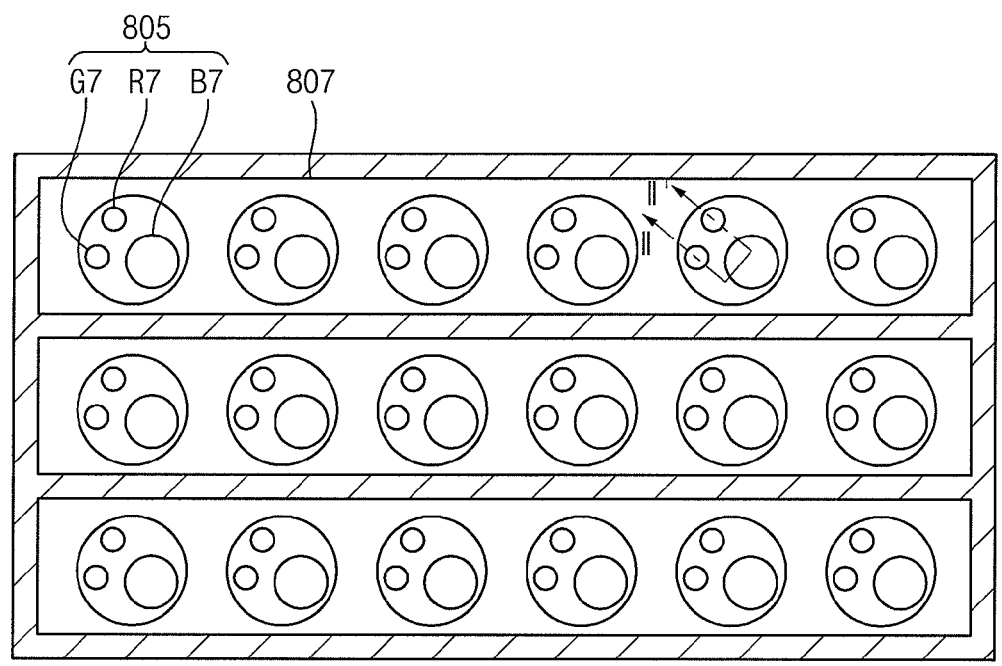
FIG. 7 is a plan view illustrating a light emitting module according to an exemplary embodiment of the present invention.
Figure 8:
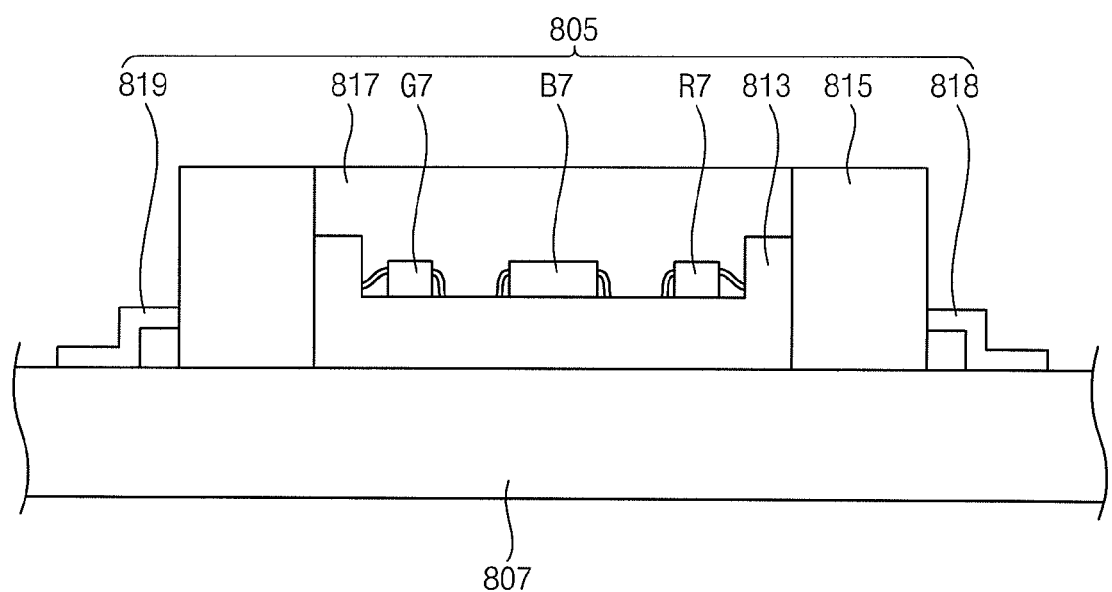
FIG. 8 is a cross-sectional view taken along a line II-II' of FIG. 7.

FIG. 7 is a plan view illustrating a light emitting module 800 according to an exemplary embodiment of the present invention. FIG. 8 is a cross-sectional view taken along a line II-II' of FIG. 7.

Referring to FIGS. 7 and 8, the light emitting module 800 includes a plurality of point light sources 805 and a substrate 807.

The light emitting module 800 is substantially same as the light emitting module 200 illustrated in FIG. 4, except the point light sources 805.

Each of the point light sources 805 may include a red light emitting chip R7, a green light emitting chip G7, a blue light emitting chip B7, a heat dissipating body 813, a housing 815, a protective layer 817, a power input terminal 818 and a power output terminal 819.

The red, green and blue light emitting chips R7, G7 and B7 are packaged into one housing 815. The red, green and blue light emitting chips R7, G7 and B7 are disposed on the heat dissipating body 813. The red, green and blue light emitting chips R7, G7 and B7, and the heat dissipating body 813 are received by the housing 815. The protective layer 817 covers the red, green and blue light emitting chips R7, G7 and B7 to protect the red, green and blue light emitting chips R7, G7 and B7. The power input terminal 818 and the power output terminal 819 are electrically connected to the red, green and blue light emitting chips R7, G7 and B7, respectively. Thus, the point light sources 805 include three power input terminals 818 and three power output terminals 819.

The red light, the green light and the blue light are mixed with the ratio of x:y:z, so that the white light is emitted. In addition, the light emitting intensities of the red, green and blue light emitting chips R7, G7 and B7 per unit power consumption and unit light emitting area are respectively L1, L2 and L3. The ratio of the necessary light emitting area is x/L1:y/L2:z/L3.

In an exemplary embodiment, the relation of z/L3>x/L1 and z/L3>y/L2 exists. Thus, the blue light emitting chip B7 corresponding to z/L3 is the restriction light emitting chip, and the light intensity of the blue light is insufficient in the same condition.

Thus, the light emitting area of the blue light emitting chip B7 is formed to be larger than that of the red light emitting chip R7 and the blue light emitting chip G7, for example, more than about twice to five times, so that the necessary mix light intensity of the blue light may be sufficient. The light emitting area of the red light emitting chip R7 may be the same or different from that of the green light emitting chip G7.

Figure 9:
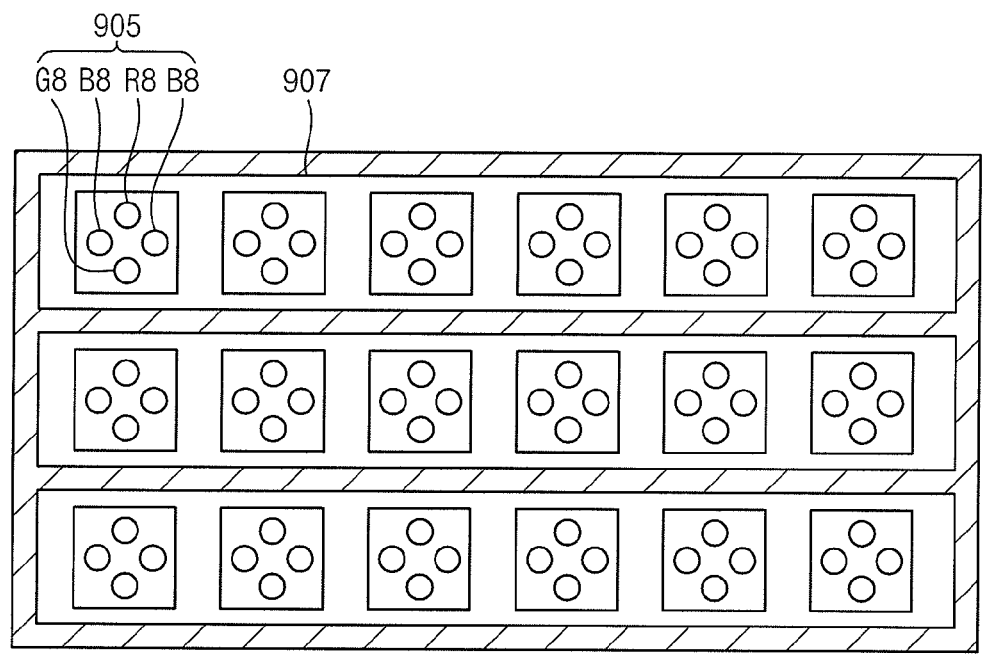
FIG. 9 is a plan view illustrating a light emitting module according to an exemplary embodiment of the present invention.

FIG. 9 is a plan view illustrating a light emitting module 900 according to an exemplary embodiment of the present invention.

Referring to FIG. 9, the light emitting module 900 includes a plurality of point light sources 905 and a substrate 907.

The light emitting module 900 is substantially same as the light emitting module 500 illustrated in FIG. 5, except the point light sources 905.

Each of the point light source 905 includes a red light emitting chip R8, a green light emitting chip G8 and two blue light emitting chips B8.

The point light sources 905 are substantially same as the point light sources 505 illustrated in FIG. 5, except that the red light emitting chip R8, the green light emitting chip G8 and two blue light emitting chips B8 are packaged into one housing. The structure that the red light emitting chip R8, the green light emitting chip G8 and two blue light emitting chips B8 are packaged into one housing, is substantially same as the packaging structure illustrated in FIG. 8.

Figure 10:
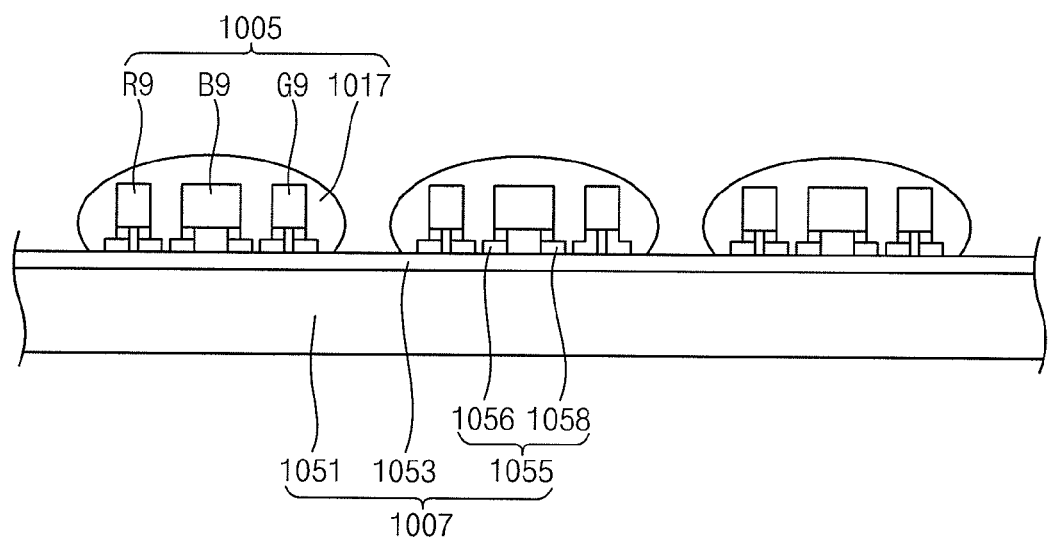
FIG. 10 is a plan view illustrating a light emitting module according to an exemplary embodiment of the present invention.

FIG. 10 is a plan view illustrating a light emitting module 1000 according to an exemplary embodiment of the present invention.

Referring to FIG. 10, the light emitting module 1000 includes a plurality of point light sources 1005 and a substrate 1007.

Each of the point light sources 1005 may include a red light emitting chip R9, a green light emitting chip G9, a blue light emitting chip B9 and a protective layer 1017. The light emitting module 1000 is substantially same as the light emitting module 200 illustrated in FIG. 4, except that the red light emitting chip R9, the green light emitting chip G9 and the blue light emitting chip B9 are not packaged into the housing but are directly mounted on the substrate 1007.

The substrate 1007 may include a metal layer 1051, an insulating layer 1053 and a line 1055. The metal layer 1051 easily dissipates heat generated from the light emitting chips to the outside. The insulating layer 1053 is formed on the metal layer 1051, and the line 1055 may include a power input part 1056 and a power output part 1058. The line 1055 is insulated by the insulating layer 1053. The power input part 1056 and the power output part 1058 are exposed to the outside of the insulating layer 1053.

The red, green and blue light emitting chips R9, G9 and B9 may respectively include a light emitting body, input and output terminals connected to the light emitting body. The light emitting body emits the red light, the green light or the blue light. The input and output terminals are respectively connected to the power input part 1056 and the power output part 1058 via soldering and so on.

In the present example embodiment, the blue light emitting chip B9 is the restriction light emitting chip, as the light emitting module 200 illustrated in FIG. 4. Thus, the blue light is insufficient for obtaining the white light, in the same condition.

In FIG. 10, the light emitting area of the blue light emitting chip B9 is larger than that of the red and green light emitting chips R9 and G9. The light emitting area of the blue light emitting chip B9 may be about twice to five times larger than that of the red and green light emitting chips R9 and G9. The light emitting area of the red light emitting chip R9 may be substantially same or different from that of the green light emitting chip G9.

According to the present invention, the red, green and blue light emitting chips of the light emitting module respectively have the light emitting area proper to the light-electrical efficiency and the mixing ratio to obtain the white light. Thus, the light emitting chip is prevented from having the smaller or larger light emitting area than is needed to obtain the necessary mix light intensity. Accordingly, the light emitting efficiency of the light emitting module that may be defined as the light emitting intensity of the white light per power consumption, is enhanced.

Although the illustrative embodiments of the present invention have been described herein with reference to the accompanying drawings, it is to be understood that the present invention should not be limited to those precise embodiments and that various other changes and modifications may be affected therein by one of ordinary skill 20 in the related art without departing from the scope or spirit of the invention. All such changes and modifications are intended to be included within the scope of the invention as defined by the appended claims.

What is claimed is:

1. A light emitting module comprising:
a plurality of point light sources having a first light emitting chip emitting first light, a second light emitting chip emitting second light, and a third light emitting chip emitting third light; and
a substrate having the point light sources disposed on the substrate, the substrate applying a driving power to the point light sources,
wherein at least one restriction light emitting chip among the first, second and third light emitting chips has a larger light emitting area than a remainder of the light emitting chips,
wherein the first, second and third light emitting chips have light emitting intensities of L1, L2 and L3 per unit power consumption and unit light emitting area, respectively, and the restriction light emitting chip has a largest value among x/L1, y/L2 and z/L3, when the first light, the second light and the third light are mixed with a ratio of x:y:z to form white light, and
wherein x is a light intensity of the first light with respect to the white light, y is a light intensity of the second light with respect to the white light, and z is a light intensity of the third light with respect to the white light.

2. The light emitting module of claim 1, wherein the light emitting areas of the first, second and third light emitting chips are in a relationship of x/L1<y/L2<z/L3.

3. The light emitting module of claim 2, wherein the light emitting area of the first light emitting chip:the light emitting area of the second light emitting chip:the light emitting area of the third light emitting chip is substantially the same as x/L1:y/L2:z/L3.

4. The light emitting module of claim 1, wherein the light emitting area of the restriction light emitting chip is about twice to about five times larger than the light emitting areas of the remainder of the light emitting chips.

5. The light emitting module of claim 1, wherein the first light emitting chip comprises a red light emitting chip emitting red light, the second light emitting chip comprises a green light emitting chip emitting green light, and the third light emitting chip comprises a blue light emitting chip emitting blue light.

6. The light emitting module of claim 5, wherein the first, second and third lights are mixed with a ratio of x:y:z to form white light, wherein x is between about 2.91 to about 3.09, y is between about 5.82 to about 6.18, and z is between about 0.97 to about 1.03, and
wherein x is a light intensity of the first light with respect to the white light, y is a light intensity of the second light with respect to the white light, and z is a light intensity of the third light with respect to the white light.

7. The light emitting module of claim 6, wherein the restriction light emitting chip includes the blue light emitting chip.

8. The light emitting module of claim 7, wherein a wavelength of the red light ($\lambda$1), a wavelength of the green light ($\lambda$2) and a wavelength of the blue light ($\lambda$3) are respectively between about 619 nm to about 631 nm, between about 518 nm to about 530 nm and between about 446 nm to about 455 nm, and
a light emitting intensity of the red light emitting chip (L1), a light emitting intensity of the green light emitting chip (L2) and a light emitting intensity of the blue light emitting chip (L3) per unit power consumption and unit light emitting area are respectively between about 237 lumen to about 239 lumen, between about 541 lumen to about 546 lumen and between about 19.8 lumen to about 20 lumen.

9. The light emitting module of claim 7, wherein the light emitting area of the blue light emitting chip is about twice to about five times larger than the light emitting area of the red light emitting chip or the light emitting area of the green light emitting chip.

10. The light emitting module of claim 9, wherein the light emitting area of the red light emitting chip is substantially the same as the light emitting area of the green light emitting chip.

11. The light emitting module of claim 7, wherein the point light sources comprise a plurality of blue light emitting chips.

12. The light emitting module of claim 11, wherein the point light sources comprise two blue light emitting chips, and each of the blue light emitting chips has substantially the same light emitting area as the light emitting areas of the red light emitting chip and the green light emitting chip.

13. The light emitting module of claim 6, wherein the restriction light emitting chip includes the green light emitting chip.

14. The light emitting module of claim 13, wherein a wavelength of the red light ($\lambda$1), a wavelength of the green light ($\lambda$2) and a wavelength of the blue light ($\lambda$3) are respectively between about 619 nm to about 631 nm, between about 518 nm to about 530 nm and between about 450.5 nm to about 460 nm, and
the light emitting intensity of the red light emitting chip (L1), the light emitting intensity of the green light emitting chip (L2) and the light emitting intensity of the blue light emitting chip (L3) per unit power consumption and unit light emitting area are respectively between about 39.6 lumen to about 40.4 lumen, between about 44.6 lumen to about 45.4 lumen and between about 9.9 lumen to about 10.1 lumen.

15. The light emitting module of claim 13, wherein the light emitting area of the green light emitting chip is about twice to about five times larger than the light emitting area of the red light emitting chip and the blue light emitting chip.

16. The light emitting module of claim 15, wherein the light emitting area of the red light emitting chip is substantially the same or different from the light emitting area of the blue light emitting chip.

17. The light emitting module of claim 1, wherein the light emitting areas of the first, second and third light emitting chips are in a relationship of $x/L1 > y/L2$, $x/L1 < z/L3$, and $y/L2 < z/L3$.

18. The light emitting module of claim 17, wherein $x/L1$ and $y/L2$ are substantially the same.

19. The light emitting module of claim 9, wherein the light emitting area of the red light emitting chip is different from the light emitting area of the green light emitting chip.

20. A display device comprising:
a plurality of point light sources having a first light emitting chip emitting first light, a second light emitting chip emitting second light, and a third light emitting chip emitting third light; and
a substrate having the point light sources disposed on the substrate, the substrate applying a driving power to the point light sources,
wherein at least one restriction light emitting chip among the first, second and third light emitting chips has a larger light emitting area than a remainder of the light emitting chips,
wherein the first light emitting chip includes a red light emitting chip emitting red light, the second light emitting chip includes a green light emitting chip emitting green light, and the third light emitting chip includes a blue light emitting chip emitting blue light, and
wherein the restriction light emitting chip includes the blue light emitting chip.

* * * * *